(12) United States Patent
Lee

(10) Patent No.: US 8,586,443 B2
(45) Date of Patent: Nov. 19, 2013

(54) METHOD OF FABRICATING PHASE CHANGE MEMORY DEVICE CAPABLE OF REDUCING DISTURBANCE

(71) Applicant: SK Hynix Inc., Gyeonggi-do (KR)

(72) Inventor: Jang Uk Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/676,433

(22) Filed: Nov. 14, 2012

(65) Prior Publication Data

US 2013/0071985 A1    Mar. 21, 2013

Related U.S. Application Data

(62) Division of application No. 12/782,839, filed on May 19, 2010, now Pat. No. 8,334,526.

(30) Foreign Application Priority Data

Dec. 22, 2009    (KR) .................. 10-2009-0128786

(51) Int. Cl.
*H01L 21/20* (2006.01)
*H01L 29/00* (2006.01)
*H01L 29/02* (2006.01)
*H01L 29/04* (2006.01)
*H01L 29/06* (2006.01)

(52) U.S. Cl.
USPC ............... 438/384; 438/382; 438/385; 257/1; 257/2; 257/3; 257/4; 257/5

(58) Field of Classification Search
None
See application file for complete search history.

(56) References Cited

U.S. PATENT DOCUMENTS

| 5,789,758 A | 8/1998 | Reinberg |
| 7,554,144 B2 | 6/2009 | Lai et al. |
| 2007/0069249 A1 * | 3/2007 | Hayakawa .................. 257/246 |
| 2008/0048170 A1 | 2/2008 | Hayakawa |
| 2009/0230378 A1 | 9/2009 | Ryoo et al. |
| 2010/0090191 A1 | 4/2010 | Lee et al. |

FOREIGN PATENT DOCUMENTS

| KR | 1020060094424 A | 8/2006 |
| KR | 1020070094348 A | 9/2007 |
| KR | 1020070097659 A | 10/2007 |
| KR | 1020080072296 A | 8/2008 |

OTHER PUBLICATIONS

USPTO RR mailed Dec. 28, 2011 in connection with U.S. Appl. No. 12/782,839.

(Continued)

*Primary Examiner* — Michael Jung
(74) *Attorney, Agent, or Firm* — Ladas & Parry LLP

(57) ABSTRACT

A phase change memory device capable of reducing disturbances between adjacent PRAM memory cells and a fabrication method are presented. The phase change memory device includes word lines, heating electrodes, an interlayer insulating layer, and a phase change lines. The word lines are formed on a semiconductor substrate and extend in parallel with a constant space. The heating electrodes are electrically connected to the plurality of word lines. The interlayer insulating layer insulates the heating electrodes. The phase change lines extend in a direction orthogonal to the word line and are electrically connected to the heating electrodes. Curves are formed on a surface of the interlayer insulating layer between the word lines such that the effective length of the phase change layer between adjacent heating electrodes is larger than the physical distance between the adjacent heating electrodes.

3 Claims, 3 Drawing Sheets

(56) References Cited

OTHER PUBLICATIONS

USPTO NFOA mailed Jan. 31, 2012 in connection with U.S. Appl. No. 12/782,839.

USTPO FOA mailed Jun. 7, 2012 in connection with U.S. Appl. No. 12/782,839.

USPTO NOA mailed Aug. 22, 2012 in connection with U.S. Appl. No. 12/782,839.

* cited by examiner

METHOD OF FABRICATING PHASE CHANGE MEMORY DEVICE CAPABLE OF REDUCING DISTURBANCE

CROSS-REFERENCES TO RELATED APPLICATION

The present application claims priority under 35 U.S.C. 119(a) to Korean application number 10-2009-0128786, filed on Dec. 22, 2009, in the Korean Patent Office, and also claims priority to the corresponding U.S. patent application Ser. No. 12/782,839 which has subsequently issued as U.S. Pat. No. 8,334,526 in which all of these priority documents are incorporated by reference in their entirety as if set forth in full.

BACKGROUND OF THE INVENTION

1. Technical Field

The inventive concept relates to a non-volatile semiconductor memory device and, more particularly, to a phase change memory device capable of reducing disturbance and a method of manufacturing the same.

2. Related Art

Semiconductor memory devices are classified into volatile memory devices and nonvolatile memory devices depending on retention of stored data after power is turned off. DRAM (Dynamic Random Access Memory) and SRAM (Static Random Access Memory) are regarded as the volatile memory devices and the flash memory devices, i.e., the EEPROM (Electrically Erasable Programmable Read Only Memory) devices are regarded as the nonvolatile memory devices.

Flash memory devices which are nonvolatile memory devices are frequently used in a variety of electronic appliances, such as, digital cameras, cellular phones, or MP3 players. However, it takes a relatively long time to program data into the flash memory devices or to read from the flash memory devices. New semiconductor devices have been developed as a substitutes of flash memory devices, such as, MRAM (Magnetic Random Access Memory), FRAM (Ferroelectric Random Access Memory) or Phase-change Random Access Memory (PRAM).

A phase change memory device as a substitute memory device uses phase change material which reversibly phase-changes between a crystalline state and an amorphous state by exposure to heat in the storage medium. Typically, a chalcogenide (GST)-based material which is comprised of germanium (Ge), antimony (Sb) and tellurium (Te) is used as the phase change material. The heat supply source for the phase change material is electric current through a conductor that releases an amount of heat (i.e., Joule heat) which depends on the intensity of the supplied current and the current supply time. Phase change materials also exhibit different resistivities according to the crystalline state and the amorphous state so that a logic information scheme can be designed which depends on the resistance differences exhibited between the phases.

However, as integrity, i.e., the compactness, of the phase memory device increases, then distances between the heating electrodes decrease. When the heating electrode is heated by supplying the current so as to write the specific cell where the information is to be obtained, then adjacent cells where the information has been already written are prone to being affected by this heat disturbance. In particular, the heat disturbance problem between cells on one phase change material line that is, on one bit line becomes more serious as the integrity of the phase memory device increases.

SUMMARY

According to one exemplary embodiment, a phase change memory device is provided. A plurality of word lines are formed on a semiconductor substrate, and extended in parallel with a constant space. A plurality of heating electrodes are electrically connected to the plurality of word lines. An interlayer insulating layer insulates the heating electrodes. A plurality of phase change lines are extended to a direction orthogonal to the word line and are electrically connected to the plurality of the heating electrodes. Curves are formed on a surface of the interlayer insulating layer between the word lines.

The curves may have a groove shape (i.e., concave), a protrusion shape (i.e., convex) or a wavy surface morphology shape.

According to another exemplary embodiment, a method of fabricating a phase change memory device is provided. A plurality of word lines are formed to extended in parallel with a constant space on a semiconductor substrate. An interlayer insulating layer is formed over the semiconductor substrate. A plurality of heating electrodes are formed in portions of the interlayer insulating layer to be connected with the plurality of word lines, respectively. Curves are formed on portions of the interlayer insulating layer between the word lines. Phase change lines are formed to be contacted to the plurality of heating electrodes and be passing the curves to be orthogonal to the word line.

These and other features, aspects, and embodiments are described below in the section entitled "DESCRIPTION OF EXEMPLARY EMBODIMENT".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DESCRIPTION OF EXEMPLARY EMBODIMENT

Figure 1:
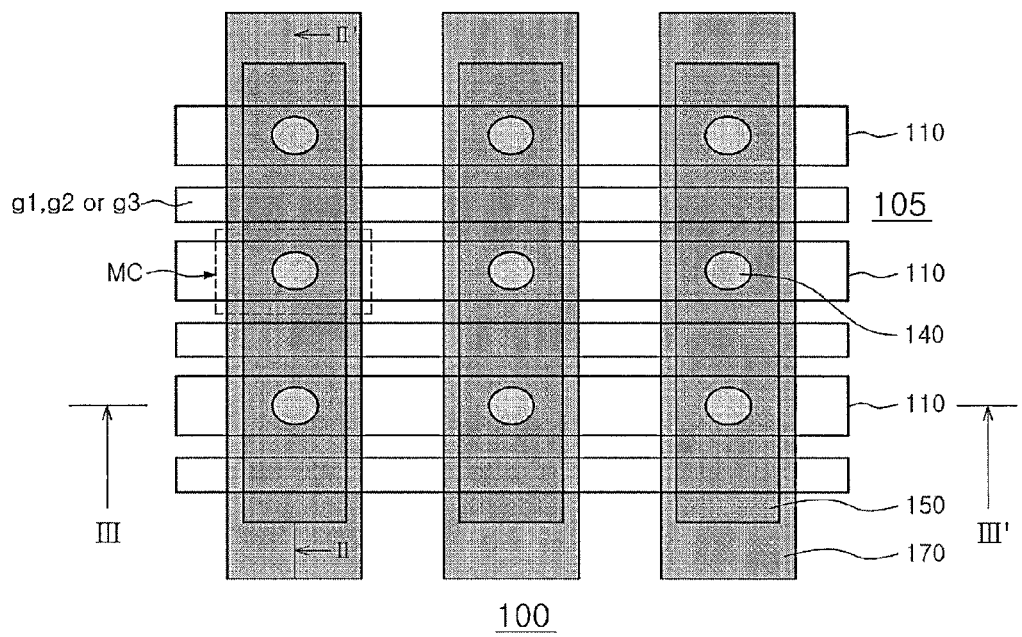
FIG. 1 is a plane view of a phase change memory device according to an exemplary embodiment.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Figure 2:
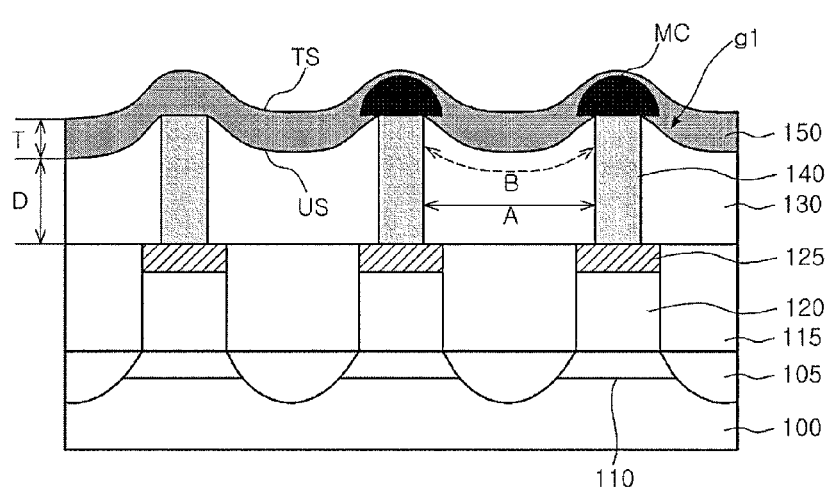
FIG. 2 is a sectional view of the phase change memory device taken along the line II-II' of FIG. 1.
Figure 3:
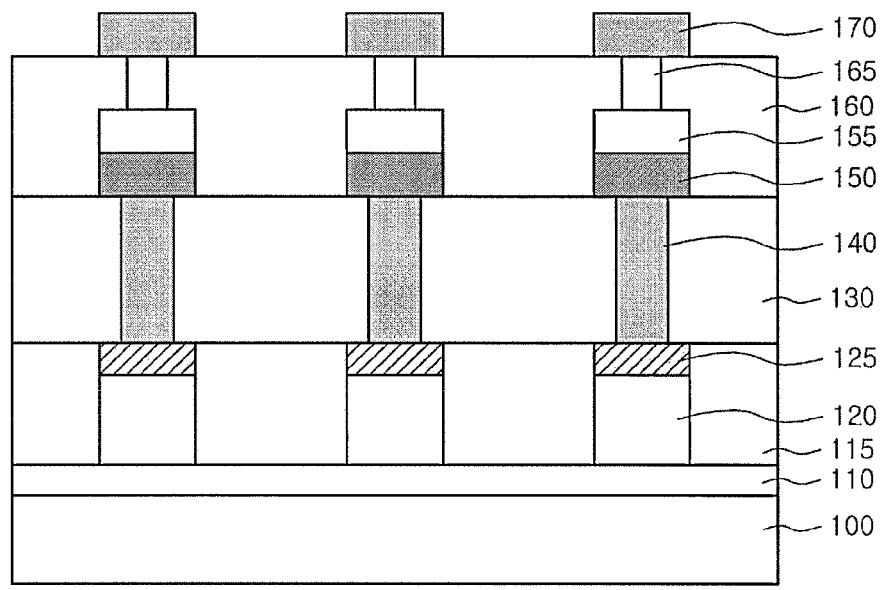
FIG. 3 is a sectional view of the phase change memory device taken along the line III-III' of FIG. 1.

FIG. 1 is a plan view of a phase change memory device according to an exemplary embodiment of this inventive concept and FIG. 2 is a sectional view of the phase change memory device taken along the line II-II' of FIG. 1 and FIG. 3 is a sectional view of the phase change memory device taken along the line of III-III' of FIG. 1.

Referring to FIG. 1, the phase change memory device formed on a semiconductor substrate 100 includes a plurality of word lines 110 and a plurality of bit lines 170 which cross each other. A plurality of phase change lines 150 which are overlapped with the plurality of bit lines 170 respectively are formed between the word lines 110 and the bit lines 170. Each of memory cells MC constituting the phase change memory device is arranged at an intersection of the word line 110 and the bit line 170 and each memory cell MC includes a heating electrode 140 for phase-changing the phase change line 150 and a switching element (not shown) connected to the heating electrode 140.

The phase change line 150 is shown overlapped with the bit line 170 to extend in parallel to the bit line 170 such that the plurality of memory cells MC are connected to one phase change line 150. According to this, when any one of the plurality of memory cells MC is driven then the phase change line 150 is partially phase-changed by the heat of corresponding heating electrode 140, a portion of the phase change line 150 corresponding to adjacent memory cell is affected by the diffusing heat at the disturbance. Problems with this diffusion of heat at this disturbance becomes more seriously as the memory device more highly integrated.

To decrease the effect of the disturbance, the exemplary embodiment suggests the method of substantially extending the effective length B of the phase change layer 150 between adjacent heating electrodes 140 along in the direction of the bit line 170 as shown in FIGS. 1 to 3 to be considerably longer than a physical length A of the phase change layer 150 between adjacent heating electrodes 140.

That is, referring to FIGS. 1 to 3, a device isolation layer 105 for defining word line regions in the semiconductor substrate 100. Impurities, for example, n type conductivity impurities are implanted into the word line regions of the semiconductor substrate 100 defined by the device isolation layer 105 to form the word lines 110.

Next, a first interlayer insulating layer 115 is formed on the semiconductor substrate 100 which the word lines 110 are formed in. Portions of the first interlayer insulating layer 115 are etched to expose portions of the word line 110, thereby forming diode contact holes. Switching diodes 120 are formed within the diode contact holes through a conventional process. The switching diodes 120 may be formed by a selective epitaxial growth (SEG) method. On the other hand, the switching diodes 120 may be formed by a deposition method, when the metal word lines (not shown) are interposed between the word lines 110 and the first interlayer insulating layer 115. Ohmic contact layers 125 are selectively formed on the switching diodes 120.

A second interlayer insulating layer 130 is formed on a resultant of the semiconductor substrate 100 where the switching diodes 120 and the ohmic contact layers 125 are formed. The second interlayer insulating layer 130 may include for example, a silicon nitride having an excellent heat-endurance material, but it is not limited thereto. Portion of the second interlayer insulating layer 130 are etched to form heating electrode contact holes exposing the ohmic contact layers 125. Next, a conduction layer is formed to be buried within the heating electrode contact holes, thereby forming heating electrodes 140. The heating electrodes 140 may include a high resistivity conductive material so as to have an excellent heat property.

So as to reduce the disturbance brought about by adjacent heating electrodes 140, curves g1 are formed portions of an upper surface US of the second interlayer insulating layer 130 between the word lines 110. The formation of the curves g1 are achieved by adjusting the second interlayer insulating layer 130 between the word lines 110 to have a variable thickness depth D as a function of distance away from the heating electrodes such that the variable thickness depth D of second interlayer insulating layer results in the curved upper surfaces US of the interlayer insulating layer between adjacent heating electrodes along a bit line direction. These curves g1 are formed to be extended in the direction parallel to the word line 110. According to this, portions of the upper surface US of the second interlayer insulating layer 130 over the word lines 110 are planar between bit lines, as shown in FIG. 3, and these curves g1 are preferably formed in the portions of the upper surface US of the second interlayer layer insulating layer 130 between the word lines 110 as shown in FIG. 2.

The curves g1 in the exemplary embodiment may be formed by isotropically etching the second interlayer insulating layer 130. At this time, the masking process may be carried out to selectively form the curves g1 in the second interlayer insulating layer 130 between the word lines 110. In the etching process to form the curve g1, the isotropic etching process may be performed so as not to expose the heating electrodes 140 arranged at both sides of the curve g1.

Figure 4:
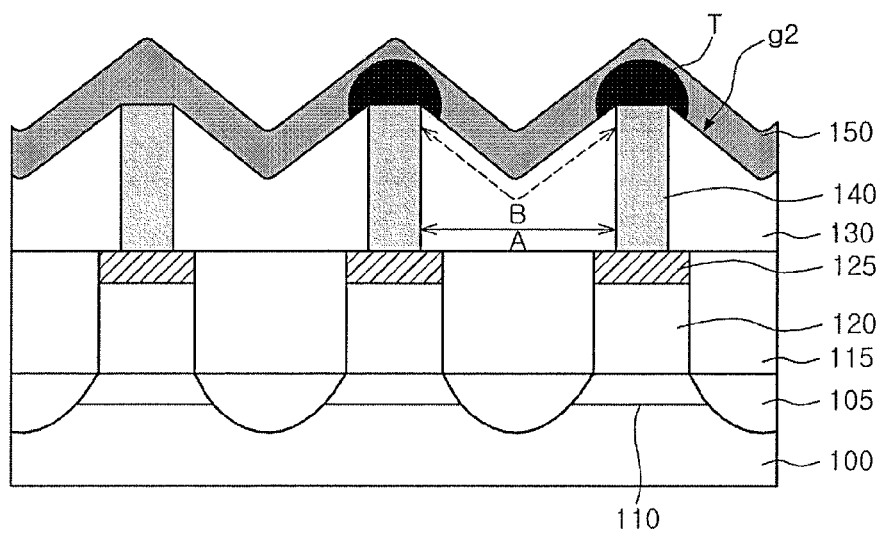
FIG. 4 is a sectional view of a phase change memory device according to another exemplary embodiment.
Figure 5:
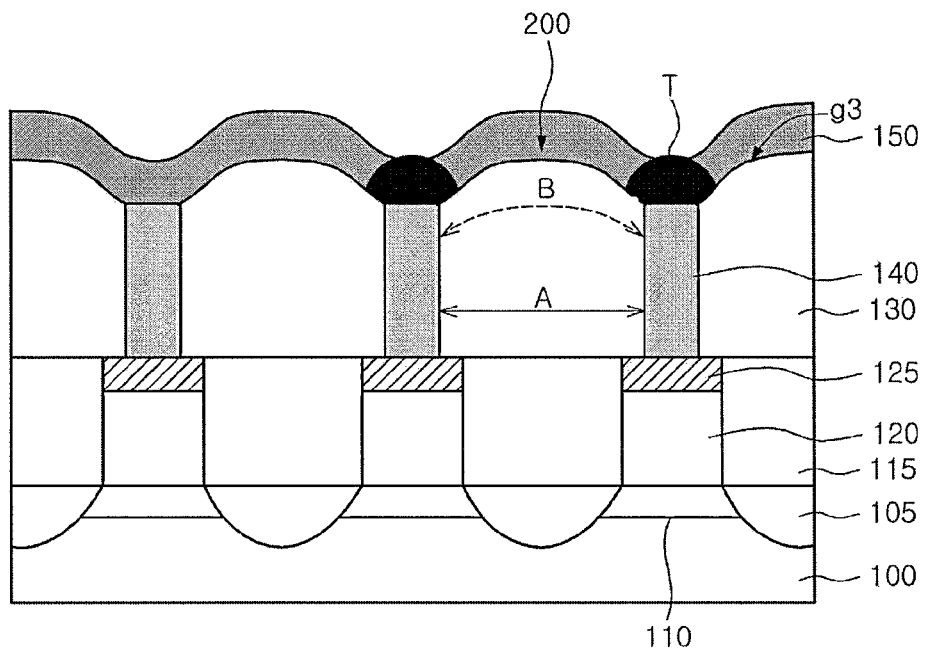
FIG. 5 is a sectional view of a phase change memory device according to another exemplary embodiment.
Figure 6:
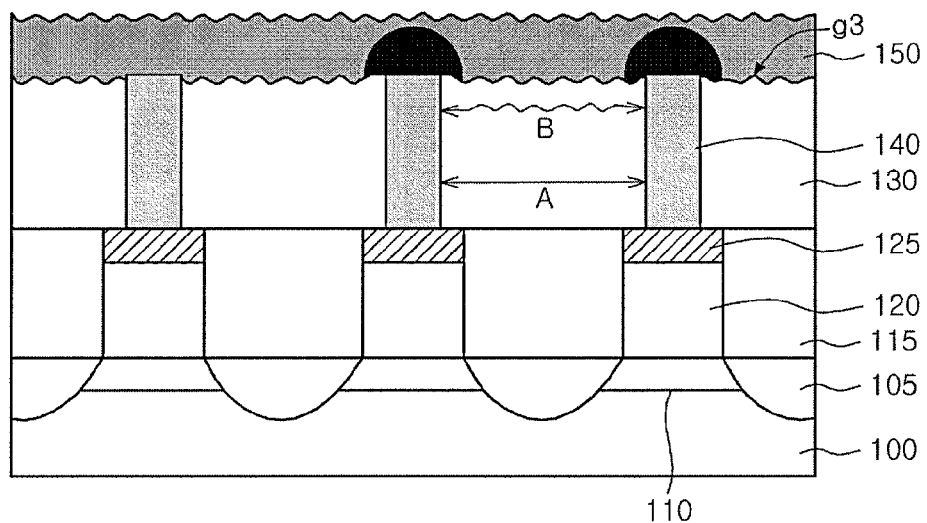
FIG. 6 is a sectional view of a phase change memory device according to still another exemplary embodiment.

Furthermore, as shown in FIG. 4, when the second interlayer insulating layer 130 is isotropically etched to form curves g2 having V-shaped groove type shapes formed by controlling etchant and time. As shown in FIG. 5, curves g3 may be formed by forming additional insulating protrusions 200 on the portions of the second interlayer insulating layer 130 between the word lines 110. The additional insulating protrusions 200 may be formed by depositing an additional insulating layer on the second interlayer insulating layer 130 and isotropically etching it. As shown in FIG. 6, curves g4 may be formed on the portions of the second interlayer insulating layer 130 between the word lines 110 in the morphology type. As shown in FIG. 6, the curves g4 can also have a wavy morphology type shape by being formed by selectively ion implanting process and etching process.

Thereinafter, turning to FIGS. 2 and 3, a phase change material layer and a top electrode layer are sequentially deposited on a resultant of the semiconductor substrate 110 where the curves g1 are formed and then patterned to form the phase change lines 150 and top electrodes 155. The phase change lines 150 and the top electrodes 155 are formed to be crossed with the word lines 110 and to be contacted to the heating electrodes 140. The phase change lines 150 substantially extend in parallel to each other and extend along a bit line direction which is substantially orthogonal to the word fines. The phase change lines preferably have a substantially uniform thickness T such that curved upper surfaces US of the interlayer insulating layer are reflected in curved top surfaces TS of these phase change lines 150.

Next, a third interlayer insulating layer 160 is formed on a resultant of the semiconductor substrate 100 where the top electrodes 155 are formed and then portions of the third interlayer insulating layer 160 are etched to form top electrode contact holes (not shown) exposing portions of the top electrodes 155. A conductive layer is buried within the top electrode contact holes to form top electrode contacts 165. Bit lines 170 are formed on the third interlayer insulating layer 160 which are electrically connected to the top electrode contacts 165 and are crossed with the word lines 110. Reference numeral MC refers to the memory cell where the reversible phase changes are thought to occur in the phase change lines 150.

If the curves g1, g2, g3 or g4 are formed in the second interlayer insulating layer 130 between the word lines 110, the effective distance between the heating electrodes 140 is increased from A to B as shown in drawings in FIGS. 2 and 4-6. According to this, the distance the heating electrodes 140 connected to one bit line 170 that is the physical distance between the memory cells MC is not changed on the plane structure. However, the substantially effective length is increased such that the effect of the disturbance can be reduced.

While certain embodiments have been described above, it will be understood that the embodiments described are by way of example only. Accordingly, the devices and methods described herein should not be limited based on the described embodiments. Rather, the systems and methods described herein should only be limited in light of the claims that follow when taken in conjunction with the above description and accompanying drawings.

What is claimed is:

1. A method of fabricating a phase change memory device, comprising:
    forming a plurality of word lines on a semiconductor substrate such that the plurality of word lines substantially extend in parallel to each other and are spaced evenly apart from each other;
    forming an interlayer insulating layer over the semiconductor substrate;
    forming a plurality of heating electrodes through the interlayer insulating layer such that the heating electrodes are connected to the plurality of word lines;
    adjusting the interlayer insulating layer to include at least one of curving portions; and
    forming a plurality of phase change lines on the interlayer insulating layer and on the heating electrodes such that the phase change lines substantially extend in parallel to each other and extend along a bit line direction which is substantially orthogonal to the plurality of word lines, wherein the phase change lines include a substantially uniform thickness along curved upper surfaces of the interlayer insulating layer,
    wherein one of the plurality of the phase change lines includes a plurality of phase change areas at contact regions with the heating electrodes, and
    wherein the curving portions are positioned between the plurality of phase change areas in one of the phase change lines.

2. The method of claim 1, wherein the step of adjusting the interlayer insulating layer to include at least one of curving portions comprises selectively isotropically etching a portion of the interlayer insulating layer between the plurality of word lines.

3. The method of claim 1, wherein the step of adjusting the interlayer insulating layer comprises forming additional amounts of the interlayer insulating layer on at least one of portions of the interlayer insulating layer between the plurality of word lines to form the convex curved upper surfaces of the interlayer insulating layer.

* * * * *